(12) United States Patent
Zach et al.

(10) Patent No.: US 12,164,277 B2
(45) Date of Patent: *Dec. 10, 2024

(54) SYSTEM AND METHOD FOR MITIGATING OVERLAY DISTORTION PATTERNS CAUSED BY A WAFER BONDING TOOL

(71) Applicant: KLA Corporation, Milpitas, CA (US)

(72) Inventors: Franz Zach, Los Gatos, CA (US); Mark D. Smith, San Jose, CA (US); Roel Gronheid, Leuven (BE)

(73) Assignee: KLA Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/378,052

(22) Filed: Oct. 9, 2023

(65) Prior Publication Data

US 2024/0053721 A1 Feb. 15, 2024

Related U.S. Application Data

(63) Continuation of application No. 17/589,516, filed on Jan. 31, 2022, now Pat. No. 11,782,411.

(Continued)

(51) Int. Cl.
*G05B 19/18* (2006.01)
*H01L 21/67* (2006.01)

(52) U.S. Cl.
CPC ...... *G05B 19/188* (2013.01); *H01L 21/67121* (2013.01); *H01L 21/67288* (2013.01); *G05B 2219/45031* (2013.01)

(58) Field of Classification Search
CPC ......... H01L 22/24; H01L 24/33; H01L 21/68; H01L 21/681; H01L 21/185;

(Continued)

(56) References Cited

U.S. PATENT DOCUMENTS 5,202,748 A 4/1993 MacDonald et al.
6,064,486 A 5/2000 Chen et al.
(Continued)

FOREIGN PATENT DOCUMENTS

CA 2334388 A1 10/2000
CN 100552908 C 10/2009
(Continued)

OTHER PUBLICATIONS

U.S. Appl. No. 17/589,630, filed Jan. 31, 2022, Franz Zach.
(Continued)

*Primary Examiner* — Ronald D Hartman, Jr.
(74) *Attorney, Agent, or Firm* — Suiter Swantz IP

(57) ABSTRACT

A system includes a wafer shape metrology sub-system configured to perform one or more shape measurements on post-bonding pairs of wafers. The system includes a controller communicatively coupled to the wafer shape metrology sub-system. The controller receives a set of measured distortion patterns. The controller applies a bonder control model to the measured distortion patterns to determine a set of overlay distortion signatures. The bonder control model is made up of a set of orthogonal wafer signatures that represent the achievable adjustments. The controller determines whether the set of overlay distortion signatures associated with the measured distortion patterns are outside tolerance limits provides one or more feedback adjustments to the bonder tool.

18 Claims, 4 Drawing Sheets

Related U.S. Application Data

(60) Provisional application No. 63/226,635, filed on Jul. 28, 2021.

(58) Field of Classification Search
CPC ............ H01L 21/187; H01L 21/67092; H01L 21/2007; H01L 21/68771
USPC ....................................................... 700/121
See application file for complete search history.

(56) References Cited

U.S. PATENT DOCUMENTS

| | | |
|---|---|---|
| 6,238,939 B1 | 5/2001 | Wachs et al. |
| 6,335,791 B1 | 1/2002 | Miyatake |
| 6,600,565 B1 | 7/2003 | Suresh et al. |
| 6,762,846 B1 | 7/2004 | Poris |
| 6,847,458 B2 | 1/2005 | Freischlad et al. |
| 7,056,751 B2 | 6/2006 | Faris |
| 7,079,257 B1 | 7/2006 | Kirkpatrick et al. |
| 7,433,051 B2 | 10/2008 | Owen |
| 7,570,796 B2 | 8/2009 | Zafar et al. |
| 7,676,077 B2 | 3/2010 | Kulkarni et al. |
| 7,875,528 B2 | 1/2011 | La Tulipe, Jr. et al. |
| 8,163,570 B2 | 4/2012 | Castex et al. |
| 8,394,719 B2 | 3/2013 | Tsen et al. |
| 8,475,612 B2 | 7/2013 | Gaudin |
| 8,575,002 B2 | 11/2013 | Broekaart et al. |
| 8,640,548 B2 | 2/2014 | Wimplinger |
| 8,703,368 B2 | 4/2014 | Lee et al. |
| 8,768,665 B2 | 7/2014 | Veeraraghavan et al. |
| 8,769,453 B2 | 7/2014 | Scheffer et al. |
| 8,859,335 B2 | 10/2014 | Lee et al. |
| 8,892,237 B2 | 11/2014 | Vaid et al. |
| 8,900,885 B1 * | 12/2014 | Hubbard ................. H01L 24/83 438/455 |
| 8,949,057 B1 | 2/2015 | Seong et al. |
| 9,087,176 B1 | 7/2015 | Chang et al. |
| 9,116,442 B2 | 8/2015 | Adel et al. |
| 9,121,684 B2 | 9/2015 | Tang et al. |
| 9,312,161 B2 | 4/2016 | Wimplinger et al. |
| 9,354,526 B2 | 5/2016 | Vukkadala et al. |
| 9,466,538 B1 | 10/2016 | Skordas et al. |
| 9,733,075 B2 | 8/2017 | Broekaart et al. |
| 9,779,202 B2 | 10/2017 | Vukkadala et al. |
| 9,852,972 B2 | 12/2017 | Seddon et al. |
| 9,915,625 B2 | 3/2018 | Gao et al. |
| 9,935,022 B2 | 4/2018 | Owen |
| 10,024,654 B2 | 7/2018 | Smith et al. |
| 10,234,772 B2 | 3/2019 | Bangar et al. |
| 10,249,523 B2 | 4/2019 | Vukkadala et al. |
| 10,267,746 B2 | 4/2019 | Duffy et al. |
| 10,325,798 B2 | 6/2019 | Wimplinger et al. |
| 10,401,279 B2 | 9/2019 | Vukkadala et al. |
| 10,622,233 B2 | 4/2020 | Hooge et al. |
| 10,788,759 B2 | 9/2020 | Tsai et al. |
| 11,289,422 B2 | 3/2022 | Yan et al. |
| 11,335,607 B2 | 5/2022 | Ip |
| 11,710,649 B2 | 7/2023 | Mizuta |
| 11,768,441 B2 | 9/2023 | Berge et al. |
| 11,782,411 B2 | 10/2023 | Zach et al. |
| 11,829,077 B2 | 11/2023 | Zach et al. |
| 2002/0071112 A1 | 6/2002 | Smith et al. |
| 2002/0105649 A1 | 8/2002 | Smith et al. |
| 2004/0023466 A1 | 2/2004 | Yamauchi |
| 2004/0075825 A1 | 4/2004 | Suresh et al. |
| 2005/0066739 A1 | 3/2005 | Gotkis et al. |
| 2005/0087578 A1 | 4/2005 | Jackson |
| 2005/0147902 A1 | 7/2005 | Schaar et al. |
| 2005/0254030 A1 | 11/2005 | Tolsma et al. |
| 2005/0271955 A1 | 12/2005 | Cherala et al. |
| 2006/0141743 A1 | 6/2006 | Best et al. |
| 2006/0170934 A1 | 8/2006 | Picciotto et al. |
| 2006/0216025 A1 | 9/2006 | Kihara et al. |
| 2007/0037318 A1 | 2/2007 | Kim |
| 2007/0064243 A1 | 3/2007 | Yunus et al. |
| 2007/0212856 A1 | 9/2007 | Owen |
| 2007/0242271 A1 | 10/2007 | Moon |
| 2008/0030701 A1 | 2/2008 | Lof |
| 2008/0057418 A1 | 3/2008 | Seltmann et al. |
| 2008/0106714 A1 | 5/2008 | Okita |
| 2008/0182344 A1 | 7/2008 | Mueller et al. |
| 2008/0188036 A1 * | 8/2008 | La Tulipe ............. H01L 23/544 438/455 |
| 2008/0199978 A1 | 8/2008 | Fu et al. |
| 2008/0316442 A1 | 12/2008 | Adel et al. |
| 2010/0102470 A1 | 4/2010 | Mokaberi |
| 2011/0172982 A1 | 7/2011 | Veeraraghavan et al. |
| 2011/0210104 A1 | 9/2011 | Wahlsten et al. |
| 2011/0265578 A1 | 11/2011 | Johnson et al. |
| 2012/0255365 A1 | 10/2012 | Wimplinger |
| 2013/0054154 A1 | 2/2013 | Broekaart et al. |
| 2013/0286395 A1 | 10/2013 | Lee et al. |
| 2014/0057450 A1 | 2/2014 | Bourbina et al. |
| 2014/0102221 A1 | 4/2014 | Rebhan et al. |
| 2014/0209230 A1 | 7/2014 | Wagenleitner |
| 2015/0044786 A1 * | 2/2015 | Huang ............. H01L 21/67092 156/359 |
| 2015/0120216 A1 | 4/2015 | Vukkadala et al. |
| 2015/0279709 A1 * | 10/2015 | La Tulipe, Jr. ... H01L 21/67259 156/367 |
| 2016/0005662 A1 | 1/2016 | Yieh et al. |
| 2017/0243853 A1 * | 8/2017 | Huang .................. H01L 21/681 |
| 2018/0165404 A1 | 6/2018 | Eyring et al. |
| 2018/0342410 A1 | 11/2018 | Hooge et al. |
| 2019/0148184 A1 | 5/2019 | Sugaya et al. |
| 2019/0206711 A1 | 7/2019 | Wimplinger et al. |
| 2019/0271542 A1 | 9/2019 | Shchegrov et al. |
| 2019/0287854 A1 | 9/2019 | Miller et al. |
| 2019/0353582 A1 | 11/2019 | Vukkadala et al. |
| 2020/0018709 A1 | 1/2020 | Hosler et al. |
| 2020/0091015 A1 | 3/2020 | Sugaya et al. |
| 2020/0328060 A1 | 10/2020 | Iizuka |
| 2021/0296147 A1 | 9/2021 | Mizuta |
| 2022/0187718 A1 | 6/2022 | Zach et al. |
| 2022/0230099 A1 | 7/2022 | Pandith et al. |
| 2022/0344282 A1 | 10/2022 | Subrahmanyan et al. |
| 2023/0030116 A1 | 2/2023 | Zach et al. |
| 2023/0032406 A1 | 2/2023 | Zach et al. |
| 2023/0035201 A1 | 2/2023 | Zach et al. |
| 2024/0094642 A1 | 3/2024 | Zach et al. |

FOREIGN PATENT DOCUMENTS

| | | | |
|---|---|---|---|
| CN | 100562784 C | 11/2009 | |
| CN | 101727011 A | 6/2010 | |
| CN | 102656678 B | 4/2015 | |
| CN | 104977816 A | 10/2015 | |
| CN | 103283000 B | 10/2016 | |
| CN | 106547171 A * | 3/2017 | |
| CN | 104658950 B | 1/2018 | |
| CN | 109451761 A * | 3/2019 | ......... B81C 1/00238 |
| CN | 106887399 B | 2/2020 | |
| CN | 109891563 B | 2/2021 | |
| CN | 114361014 A | 4/2022 | |
| EP | 1829130 A1 | 9/2007 | |
| EP | 2299472 A1 | 3/2011 | |
| EP | 2463892 A1 | 6/2012 | |
| EP | 2463892 B1 | 4/2013 | |
| EP | 2656378 B1 | 3/2015 | |
| EP | 2863421 A1 | 4/2015 | |
| EP | 1829130 B1 | 7/2016 | |
| EP | 2854157 B1 | 1/2019 | |
| EP | 3460833 A1 | 3/2019 | |
| GB | 2462734 B | 5/2010 | |
| JP | H11135413 A | 5/1999 | |
| JP | H11176749 A | 7/1999 | |
| JP | 2001068429 A | 3/2001 | |
| JP | 2001077012 A | 3/2001 | |
| JP | 2002118052 A | 4/2002 | |
| JP | 2002229044 | 9/2005 | |
| JP | 2005233928 A | 9/2005 | |
| JP | 2005251972 A | 9/2005 | |
| JP | 2006186377 A | 7/2006 | |
| JP | 2007158200 A | 6/2007 | |

(56) References Cited

FOREIGN PATENT DOCUMENTS

| | | | | |
|---|---|---|---|---|
| JP | 2007173526 | A | 7/2007 | |
| JP | 2009113312 | A | 5/2009 | |
| JP | 2009529785 | A | 8/2009 | |
| JP | 2009239095 | A | 10/2009 | |
| JP | 2009294001 | B | 12/2009 | |
| JP | 2010529659 | A | 8/2010 | |
| JP | 2010272707 | A | 12/2010 | |
| JP | 5611371 | B2 | 10/2014 | |
| JP | 6279324 | B2 | 2/2018 | |
| JP | 2022098312 | A * | 7/2022 | ............ G06T 7/001 |
| KR | 20040014686 | A | 2/2004 | |
| KR | 20040046696 | A | 6/2004 | |
| KR | 100914446 | B1 | 8/2009 | |
| KR | 20090099871 | A | 9/2009 | |
| KR | 101313909 | B1 | 10/2013 | |
| KR | 101801409 | B1 | 12/2017 | |
| KR | 101849443 | B1 | 4/2018 | |
| KR | 101866622 | B1 | 6/2018 | |
| KR | 101866719 | B1 | 6/2018 | |
| KR | 20180065033 | A | 6/2018 | |
| KR | 102161093 | B1 | 9/2020 | |
| SG | 181435 | A1 | 7/2012 | |
| SG | 187694 | A1 | 3/2013 | |
| TW | I447842 | B | 8/2014 | |
| TW | I563548 | B | 12/2016 | |
| TW | I563549 | B | 12/2016 | |
| TW | I618130 | B | 3/2018 | |
| TW | I680506 | B | 12/2019 | |
| WO | 2005067046 | A1 | 7/2005 | |
| WO | 2009113312 | A1 | 9/2009 | |
| WO | 2012079786 | A1 | 6/2012 | |
| WO | 2012083978 | A1 | 6/2012 | |
| WO | 2012126752 | A1 | 9/2012 | |
| WO | 2012135513 | A1 | 10/2012 | |
| WO | 2013158039 | A3 | 6/2016 | |
| WO | WO-2019146427 | A1 * | 8/2019 | ............ B23K 20/00 |
| WO | 2020226152 | A1 | 11/2020 | |
| WO | WO-2021106527 | A1 * | 6/2021 | |

OTHER PUBLICATIONS

U.S. Appl. No. 17/589,704, filed Jan. 31, 2022, Franz Zach.
U.S. Appl. No. 17/161,369, filed Jan. 28, 2021, Zach et al.
U.S. Appl. No. 17/563,477, filed Jan. 28, 2021, Zach et al.
Aitken et al., (2006). Discussion of tooling solutions for the direct bonding of silicon wafers. Microsystem Technologies. 12. 413-417. 10.1007/s00542-005-0028-4.
Aitken et al., "Glass-Glass Wafer Bonding for Microfluidic Devices." Proceedings of the 2008 Second International Conference on Integration and Commercialization of Micro and Nanosystems. 2008 Second International Conference on Integration and Commercialization of Micro and Nanosystems. Clear Water Bay, Kowloon, Hong Kong. Jun. 3-5, 2008. pp. 529-533. ASME. https://doi.org/10.1115/MicroNano2008-70293.
Aitken, et al. "Discussion of tooling solutions for the direct bonding of silicon wafers." Microsystem Technologies 12 (2006): 413-417.
Asundi et al., "Rapid Defect Detections of Bonded Wafer Using Near Infrared Polariscope", Nanyang Technological University Singapore2011, Retrieved From.
Burns et al., "A wafer-scale 3-D circuit integration technology," in IEEE Transactions on Electron Devices, vol. 53, No. 10, pp. 2507-2516, Oct. 2006, doi: 10.1109/TED.2006.882043.
Burns J. et al. (2008) An SOI-Based 3D Circuit Integration Technology. In: Tan C., Gutmann R., Reif L. (eds) Wafer Level 3-D ICs Process Technology. Integrated Circuits and Systems. Springer, Boston, MA. https://doi.org/10.1007/978-0-387-76534-1_8.
Burns, et al. "An SOI-based three-dimensional integrated circuit technology." 2000 IEEE International SOI Conference. Proceedings (Cat. No. 00CH37125) (2000): 20-21.
Burns, J.A., et al., "A wafer-scale 3-D circuit integration technology," in IEEE Transactions on Electron Devices, vol. 53, No. 10, pp. 2507-2516, Oct. 2006, doi: 10.1109/TED.2006.882043.

Byelyayev, Anton, "Stress diagnostics and crack detection in full-size silicon wafers using resonance ultrasonic vibrations" (2005). Graduate Theses and Dissertations.http://scholarcommons.usf.edu/etd/2969.
Chan, et al. "An approach for alignment, mounting, and integration of IXO mirror segments." Optical Engineering + Applications (2009).
Chen, Kuan-Neng (2005). Copper Wafer Bonding in Three-Dimensional Integration [Published Doctoral thesis] Massachusetts Institute of Technology.
Chen, Kuan-Neng (2005). Copper Wafer Bonding in Three-Dimensional Integration [Unpublished Doctoral thesis] Massachusetts Institute of Technology.
Choi et al., (2005). Distortion and overlay performance of UV step and repeat imprint lithography. Microelectronic Engineering. 78-79. 633-640. 10.1016/j.mee.2004.12.097.
Choi, et al., Distortion and overlay performance of UV step and repeat imprint lithography, Microelectronic Engineering, vols. 78-79, 2005, pp. 633-640, ISSN 0167-9317, https://doi.org/10.1016/j.mee.2004.12.097.
Cotte, et al., "Film stress changes during anodic bonding of NGL masks," Proc. SPIE 3997, Emerging Lithographic Technologies IV, (Jul. 21, 2000); https://doi.org/10.1117/12.390089.
De Wolf, "Raman Spectroscopy: About Chips and Stress", Ramanspectoscopy, IMEC, Kapeldreef 75, B-3001 Leuven, Belgium 2003.
Di Cioccio, et al., "Direct bonding for wafer level 3D integration," 2010 IEEE International Conference on Integrated Circuit Design and Technology, 2010, pp. 110-113, doi: 10.1109/ICICDT.2010.5510276.
Di Cioccio, L. et al., "Direct bonding for wafer level 3D integration," 2010 IEEE International Conference on Integrated Circuit Design and Technology, 2010, pp. 110-113, doi: 10.1109/ICICDT.2010.5510276.
Feng, et al., (Jan. 14, 2007). "On the Stoney Formula for a Thin Film/Substrate System With Nonuniform Substrate Thickness." ASME. J. Appl. Mech. Nov. 2007; 74(6): 1276-1281. https://doi.org/10.1115/1.2745392.
Garnier, A. et al., "Results on aligned SiO2/SiO2 direct wafer-to-wafer low temperature bonding for 3D integration," 2009 IEEE International SOI Conference, 2009, pp. 1-2, doi: 10.1109/SOI.2009.5318753.
Garnier, et al., "Results on aligned SiO2/SiO2 direct wafer-to-wafer low temperature bonding for 3D integration," 2009 IEEE International SOI Conference, 2009, pp. 1-2, doi: 10.1109/SOI.2009.5318753.
Gegenwarth et al., "Effect Of Plastic Deformation Of Silicon Wafers On Overlay", Proc. SPIE 0100, Developments in Semiconductor Microlithography II, (Aug. 8, 1977); https://doi.org/10.1117/12.955355.
Goyal, et al., "Solder bonding for microelectromechanical systems (MEMS) applications," Proc. SPIE 4980, Reliability, Testing, and Characterization of MEMS/MOEMS II, (Jan. 16, 2003); https://doi.org/10.1117/12.478202.
Hanna et al., (1999). Numerical and experimental study of the evolution of stresses in flip chip assemblies during assembly and thermal cycling. 1001-1009. 10.1109/ECTC.1999.776308.
Hanna, et al., "Numerical and experimental study of the evolution of stresses in flip chip assemblies during assembly and thermal cycling," 1999 Proceedings. 49th Electronic Components and Technology Conference (Cat. No. 99CH36299), 1999, pp. 1001-1009, doi: 10.1109/ECTC.1999.776308.
Horn et al., (2008). Detection and Quantification of Surface Nanotopography-Induced Residual Stress Fields in Wafer-Bonded Silicon. Journal of The Electrochemical Society. 155. H36-H42. 10.1149/1.2799880.
Huston, et al., (2004). Active membrane masks for improved overlay performance in proximity lithography. Proc SPIE. 5388. 11-19. 10.1117/12.546598.
International Search Report and Written Opinion in Application No. PCT/US2021/061310 dated Mar. 28, 2022, 8 pages.
Lim, et al., "Warpage Modeling and Characterization to Simulate the Fabrication Process of Wafer-Level Adhesive Bonding," 2007

(56) References Cited

OTHER PUBLICATIONS

32nd IEEE/CPMT International Electronic Manufacturing Technology Symposium, 2007, pp. 298-302, doi: 10.1109/IEMT.2007.4417081.

Liu et al., Application of IVS Overlay Measurement to Wager Deformation Characterization Study (2004).

Liu, et al., "Application of IVS Overlay Measurement to Wafer Deformation Characterization Study." (2004).

Meinhold et al., "Sensitive strain measurements of bonded SOI films using Moire/spl acute/," in IEEE Transactions on Semiconductor Manufacturing, vol. 17, No. 1, pp. 35-41, Feb. 2004, doi: 10.1109/TSM.2003.823259.

Meinhold, et al., (2004). Sensitive Strain Measurements of Bonded SOI Films Using Moiré. Semiconductor Manufacturing, IEEE Transactions on. 17. 35-41. 10.1109/TSM.2003.823259.

Nagarajan, R. (2008). Commercialization of low temperature copper thermocompression bonding for 3D integrated circuits. [Published Masters thesis] Massachusetts Institute of Technology.

Nagarajan, R. (2009). Commercialization of low temperature copper thermocompression bonding for 3D integrated circuits. [unpublished Masters thesis] Massachusetts Institute of Technology.

Nagaswami et al., Overlay error components in double-patterning lithography, retrieved from Internet Sep. 2010.

Nagaswami, et al., "Double Patterning Lithography Overlay Components," 6th International Symp. on Immersion Lithography Extensions, Prague, Nov. 2009.

Nagaswami, et al., "DPL Overlay Components," 6th International Symp. on Immersion Lithography Extensions, Prague, Nov. 2009.

Nagaswami, et al., (2010). Overlay error components in double-patterning lithography. Solid State Technology. 53. 26-28.

Raghunathan et al., "Correlation of overlay performance and reticle substrate non-flatness effects in EUV lithography", Proc. SPIE 7488, Photomask Technology 2009, 748816 (Sep. 30, 2009); https://doi.org/10.1117/12.834746.

Raghunathan, et al., (2009). Correlation of overlay performance and reticle substrate non-flatness effects in EUV lithography. Proc SPIE. 7488. 10.1117/12.834746.

Rudack et al., "IR microscopy as an early electrical yield indicator in bonded wafer pairs used for 3D integration," Proc. SPIE 7638, Metrology, Inspection, and Process Control for Microlithography XXIV, 763815 (Apr. 1, 2010); https://doi.org/10.1117/12.848400.

Rudack, et al., (2010). IR microscopy as an early electrical yield indicator in bonded wafer pairs used for 3D integration. 10.1117/12.848400.

Schaper, et al., "Induced thermal stress fields for three-dimensional distortion control of Si wafer topography", <i>Review of Scientific Instruments</i>, vol. 75, No. 6, pp. 1997-2002, 2004. doi:10.1063/1.1753101.

Search Report and Written Opinion in International Application No. PCT/US2022/036745 dated Nov. 9, 2022, 8 pages.

Search Report and Written Opinion in International Application No. PCT/US2022/037522 dated Nov. 9, 2022. 9 pages.

Search Report and Written Opinion in International Application No. PCT/US2022/038412 dated Nov. 16, 2022, 8 pages.

Shetty, et al., "Impact of laser spike annealing dwell time on wafer stress and photolithography overlay errors," 2009 International Workshop on Junction Technology, 2009, pp. 119-122, doi: 10.1109/IWJT.2009.5166234.

Steen et al., (2007). Overlay as the key to drive wafer scale 3D integration. Microelectronic Engineering. 84. 1412-1415. 10.1016/j.mee.2007.01.231.

Steen, et al. "Overlay as the key to drive wafer scale 3D integration." Microelectronic Engineering 84 (2007): 1412-1415.

Tanaka, Tetsu et al., "3D LSI technology and reliability issues", Digest of Technical Papers—Symposium on VLSI Technology (2011).

Tippur, Hareesh V.. "Simultaneous and real-time measurement of slope and curvature fringes in thin structures using shearing interferometery." Optical Engineering 43 (2004): 3014-3020.

Tupek, et al., "Submicron aligned wafer bonding via capillary forces." Journal of Vacuum Science & Technology B 25 (2007): 1976-1981.

Tupek, Michael et al., "Submicron aligned wafer bonding via capillary forces." Journal of Vacuum Science & Technology B 25 (2007): 1976-1981.

Turner et al., "Predicting distortions and overlay errors due to wafer deformation during chucking on lithography scanners," J. Micro/Nanolith. MEMS MOEMS 8(4) 043015 (Oct. 1, 2009) https://doi.org/10.1117/1.3247857.

Turner, et al., (2002). Modeling of direct wafer bonding: Effect of wafer bow and etch patterns. Journal of Applied Physics. 92. 7658-7666. 10.1063/1.1521792.

Turner, et al., (2004). Mechanics of wafer bonding: Effect of clamping. Journal of Applied Physics. 95. 10.1063/1.1629776.

Turner, et al., "Mechanics of direct wafer bonding." Proceedings of the Royal Society A: Mathematical, Physical and Engineering Sciences 462 (2005): 171-188.

Turner, K. T.et al., "Modeling of direct wafer bonding: Effect of wafer bow and etch patterns", Journal of Applied Physics, vol. 92, No. 12, pp. 7658-7666, 2002. doi:10.1063/1.1521792.

Turner, Kevin T. et al. "Predicting distortions and overlay errors due to wafer deformation during chucking on lithography scanners." Journal of Micro-nanolithography Mems and Moems 8 (2009): 043015.

Turner, Kevin T., "Wafer-Bonding: Mechanics-Based Models and Experiments", Massachusetts Institute of Technology, May 2004, Thesis, 186 pages.

Y Gogotsi et al., "Raman Microspectroscopy Study of Processing-Induced Phase Transformations and Residual Stress in Silicon", Semiconductor Science and Technology, vol. 14, No. 10, Department of Mechanical Engineering, University of Illinois at Chicago, Chicago, IL, Mar. 4, 1999.

Korean Intellectual Property Office, International Search Report and Written Opinion for International Application No. PCT/US2023/032022, Dec. 28, 2023, 9 pages.

\* cited by examiner

SYSTEM AND METHOD FOR MITIGATING OVERLAY DISTORTION PATTERNS CAUSED BY A WAFER BONDING TOOL

CROSS-REFERENCE TO RELATED APPLICATION

The present application is a continuation application of U.S. Non-Provisional patent application Ser. No. 17/589,516, filed on Jan. 31, 2022, which claims the benefit under 35 U.S.C. § 119(e) of U.S. Provisional Application Ser. No. 63/226,635, filed Jul. 28, 2021, whereby each of the above-listed applications is incorporated herein by reference in the entirety.

TECHNICAL FIELD

The present invention generally relates to the field of wafer shape metrology, and, more particularly, to a system and method for modeling and minimizing the overlay distortion patterns caused by a bonding tool.

BACKGROUND

Bonding tools used in the production of bonded wafer pairs have long been known to introduce distortions in the overlay between features of the various bonded wafers. These distortions in the overlay can lead to reliability concerns from long term use or, in extreme cases, a lack of electrical continuity. Therefore, the ability of bonding tools to provide corrections to minimize distortions in the overlay is necessary.

Traditional methods of controlling bonding tools to minimize distortions in the overlay are quickly becoming outdated as new technologies for adjusting bonding tools are being developed. The models used for adjusting the bonding tools no longer are able to account for the new ways bonding tools are able to be adjusted for preventing distortions.

Therefore, it would be desirable to provide a system and method that cure the shortfalls of the previous approaches identified above.

SUMMARY

A system is disclosed, in accordance with one or more embodiments of the present disclosure. In one embodiment, the system includes a wafer shape metrology sub-system configured to perform one or more shape measurements on two pre-bonding wafers and the corresponding post-bonding pair of wafers. In another embodiment, the system includes a controller communicatively coupled to the wafer shape metrology sub-system, the controller including one or more processors configured to execute a set of program instructions stored in a memory. In another embodiment, the set of program instructions are configured to cause the one or more processors to: receive a set of measured bonding distortions; apply a bonder control model to the set of measured bonding distortions, wherein the bonder control model relates a set of adjustments of the bonder tool to the set of overlay distortion signatures between the first wafer and the second wafer of the bonder wafer pair; determine whether the set of overlay distortion signatures associated with the measured bonding distortions are outside tolerance limits; and provide one or more feedback adjustments to the bonder tool to adjust one or more bonder tool adjustors when the set of overlay distortion signatures are outside tolerance limits.

A method is disclosed, in accordance with one or more embodiments of the present disclosure. In one embodiment, for the purpose of calibrating the bonder the method may include running a set of wafers with a set of known bonder adjustments. Extract the resulting distortion through measurements of the wafer shapes pre as well as post bonding. Store the resulting distortion patterns either as a numerical vector pattern or described through an analytical description of the vector map. This analytical description may use wafer locations as a descriptor. It may also describe the actuator induced distortion in the form of a relative modification of an existing pattern. In another embodiment, the method may include applying a bonder control model to the proposed bonder tool adjustments to determine a set of overlay distortion signatures between a first wafer and a second wafer of a bonded wafer pair, wherein the bonder control model relates a set of adjustments of the bonder tool to the set of overlay distortion signatures between the first wafer and the second wafer of the bonder wafer pair and is an orthogonal set of wafer signatures.

In another embodiment, the method may include determining whether the set of overlay distortion signatures associated with the proposed bonder tool adjustments are outside tolerance limits. In another embodiment, the method may include providing a feedback adjustment to the bonder tool to adjust one or more adjustors of the bonder tool when the set of overlay distortion signatures are outside tolerance limits.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Figure 1A:
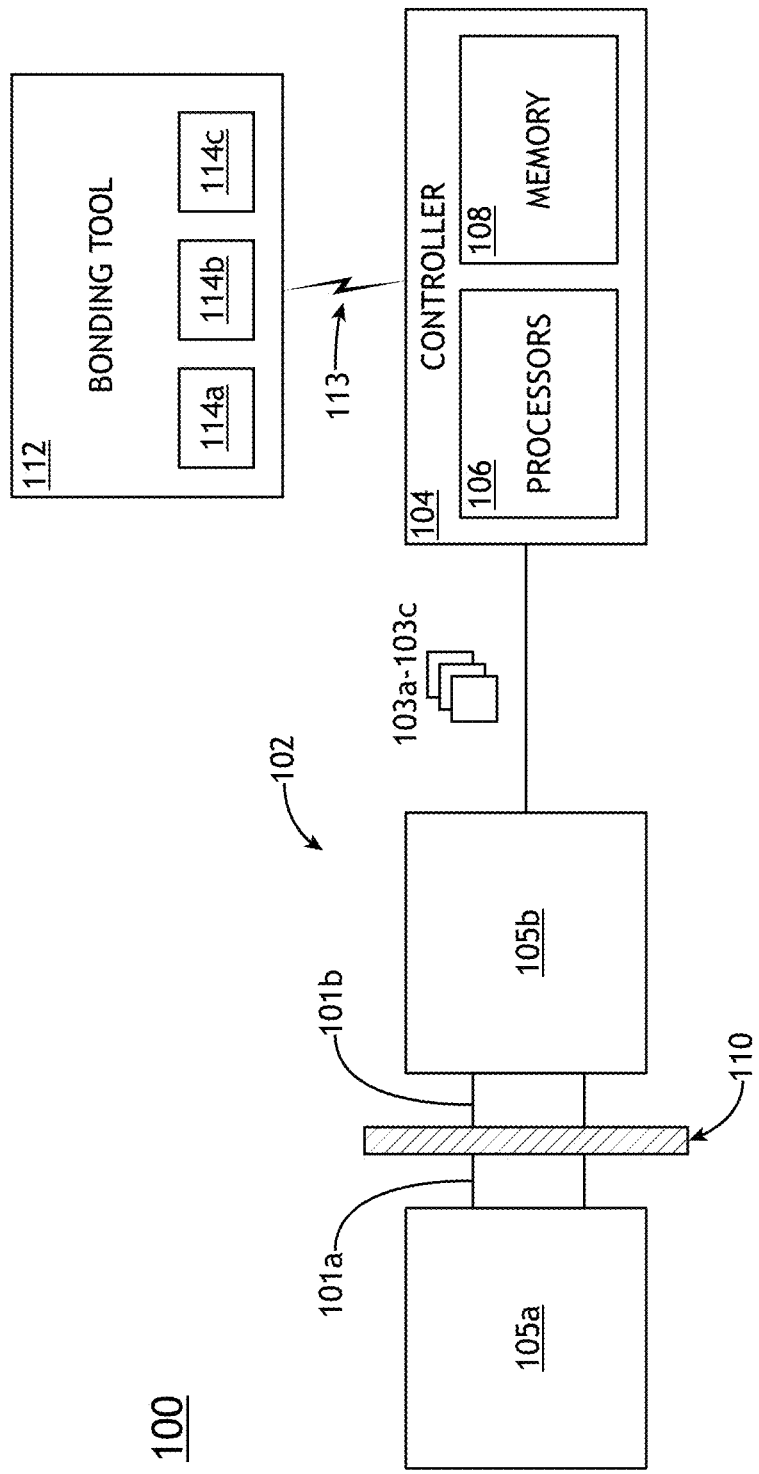
FIG. 1A illustrates a simplified block diagram of the wafer shape metrology system depicting feedback control of a bonding tool, in accordance with one or more embodiments of the present disclosure.
Figure 1B:
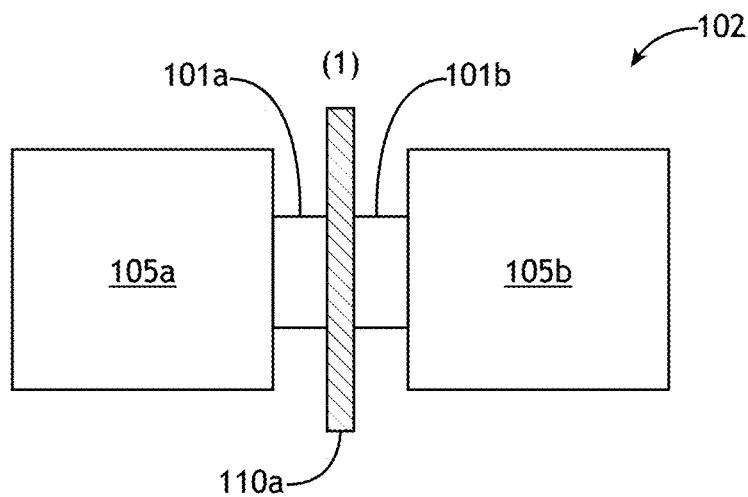
FIG. 1B illustrates a conceptual view of the wafer shape metrology system performing wafer shape measures on a first wafer, a second wafer, and a post-bonded pair of wafers, in accordance with one or more embodiments of the present disclosure.
Figure 1B:
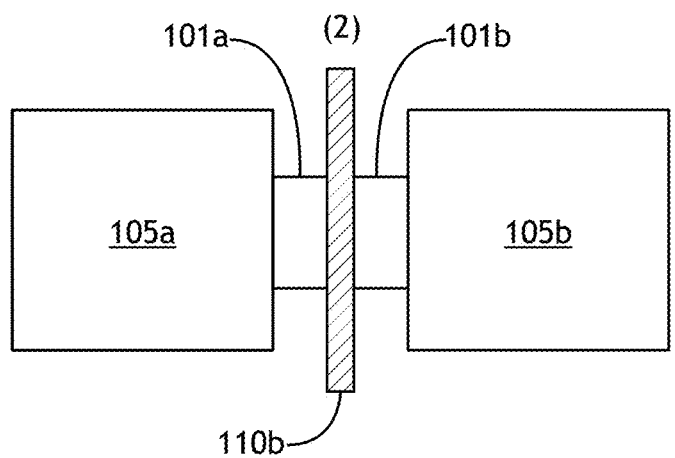
Figure 1B:
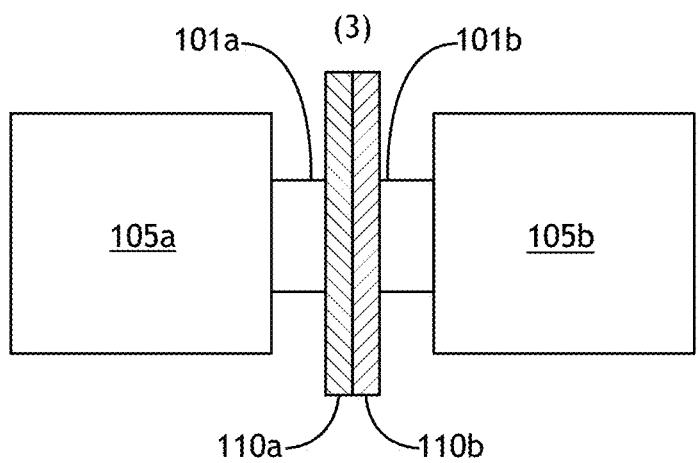
Figure 2:
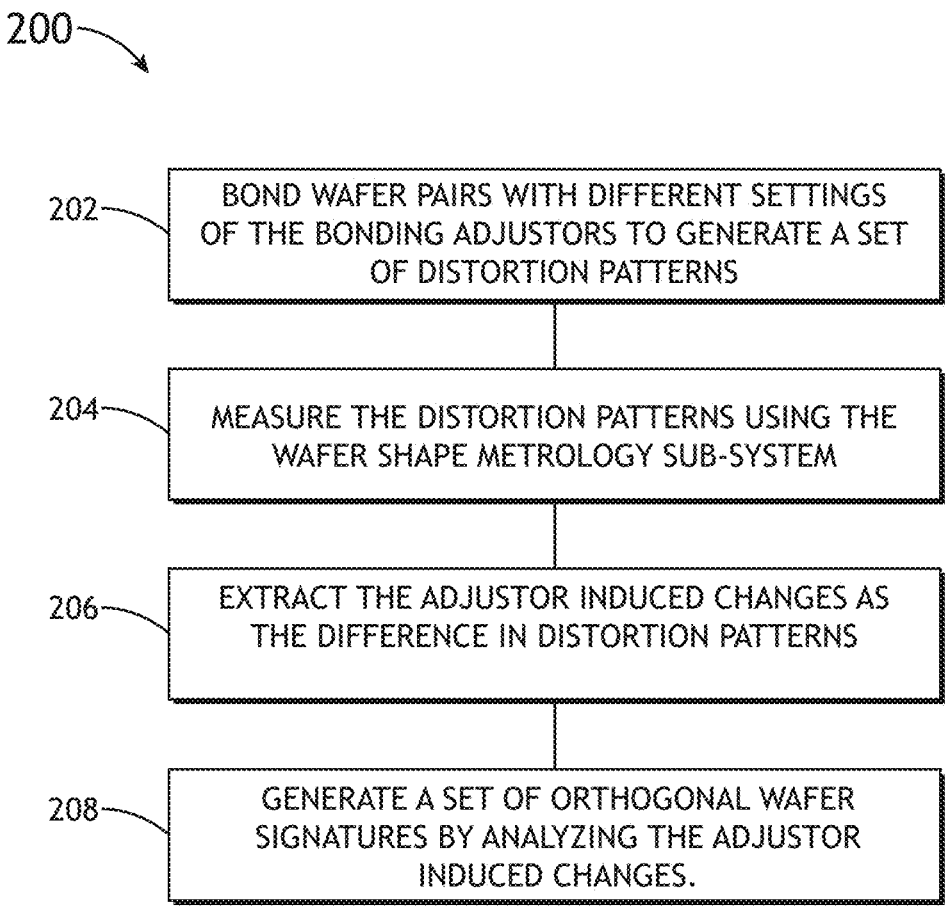
FIG. 2 illustrates a flow diagram depicting a method of generating a bonder control model, in accordance with one or more embodiments of the present disclosure.
Figure 3:
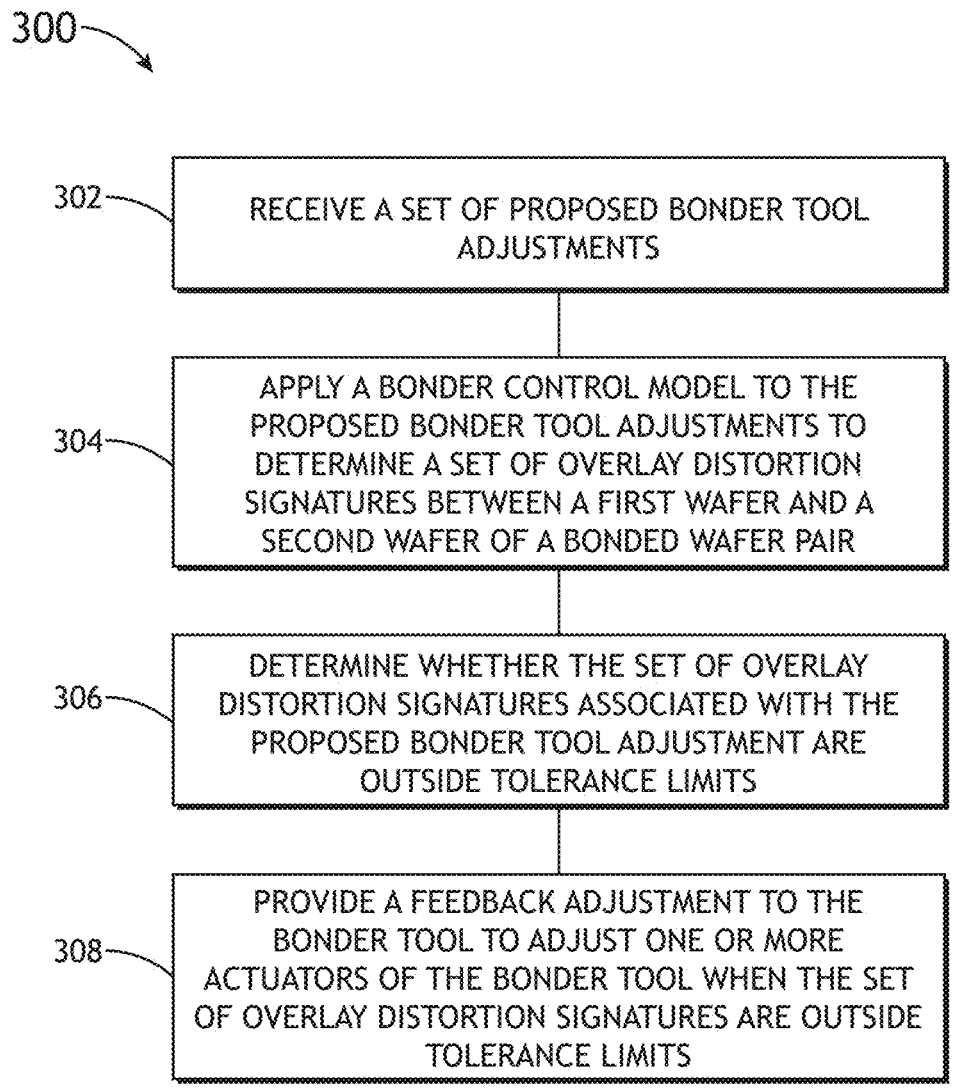
FIG. 3 illustrates a flow diagram depicting a method of utilizing a bonder control model to report feedback to a bonding tool, in accordance with one or more embodiments of the present disclosure.

Referring generally to FIGS. 1-3, a system and method for mitigating the overlay distortion patterns caused by a wafer bonding tool is described, in accordance with one or more embodiments of the present disclosure.

Embodiments of the present disclosure are directed to a system and method for modeling overlay distortion patterns caused by a bonding tool while bonding a pair of wafers. Embodiments of the present disclosure may implement a bonding control model to determine whether a post bonding distortion pattern is within an acceptable tolerance level. For example, embodiments of the present disclosure may implement a bonding control model to minimize the post bonding generated distortion patterns. Embodiments of the present disclosure may generate the bonding control model by analyzing overlay distortion patterns from bonded-wafer pairs using one or more algorithms. Additional embodiments of the present disclosure may provide feedback to a bonding tool if the given set of distortion patterns is not within an acceptable tolerance range. The feedback to a bonding tool may be in the form of one or more adjustments to one or more adjustors on the bonding tool.

Embodiments of the present disclosure may be implemented to achieve tight overlay requirements on two wafers after a wafer-to-wafer bonding process (e.g., hybrid or fusion bonding). For example, embodiments of the present disclosure may be utilized to minimize/mitigate overlay in the wafer-to-wafer bonding processes involved in the following: fabrication of image sensors (e.g., backlit image sensor technology); 3D NAND technologies where a device wafer and a memory wafer are bonded together; and backside power rail processes in logic device where a device wafer is bonded to a carrier wafer. In all these examples, tight overlay tolerance requirements are present. In image sensor and 3D NAND technologies, the overlay requirements are implemented to ensure a reliable connection between Cu-pads on one wafer to Cu-pads on the other wafer for a direct electrical connection. In the case of backside power rail technologies, it is desirable to achieve a low wafer distortion to ensure that the subsequent lithographic exposure of through silicon vias can achieve the required overlay tolerances given typical correction capabilities of the scanner (e.g., corrections per field (CPE) correction).

The process for modeling and minimizing distortions controlled by the bonding tool may include, but is not limited to, the following: i) receiving a set of measured distortion patterns; ii) applying a bonder control model to the measured distortion patterns; iii) determining whether the bonding tool adjustments are within an acceptable tolerance range; and iv) providing a feedback adjustment to a bonding tool if not in an acceptable tolerance range. In the case of a feedback adjustment, the adjustment may be used to optimize the bonder settings for subsequent wafers.

FIG. 1 illustrates a simplified block diagram of the wafer shape metrology system depicting feedback control of a bonding tool, in accordance with one or more embodiments of the present disclosure.

In embodiments, the system 100 includes a wafer shape metrology sub-system 102. The system 100 may also include a controller 104 communicatively coupled to a detector output of the wafer shape metrology sub-system 102. The controller 104 may include one or more processors 106 and memory 108. The one or more processors 106 of the controller 104 may be configured to execute a set of program instructions stored in memory 108. The set of program instructions may be configured to cause the one or more processors 106 to carry out various steps and processes of the present disclosure.

The wafer shape metrology sub-system 102 may include any wafer geometry tool or system known in the art capable of acquiring one or more shape parameters from one or more wafers. In embodiments, the wafer shape metrology sub-system 102 includes an interferometer sub-system configured to perform one or more metrology and/or characterization processes on one or more wafers. For example, the wafer shape metrology sub-system 102 may include a dual interferometer system (e.g., dual Fizeau interferometer) configured to perform measurements on opposite sides of a wafer. For instance, wafer shape metrology sub-system 102 may include a first interferometer sub-system 105$a$ configured to generate a first illumination beam 101$a$ in order to perform one or more measurements on a first surface of the wafer, and a second interferometer sub-system 105$b$ configured to generate a second illumination beam 101$b$ in order to perform one or more measurements on a second surface of the wafer opposite the first surface. The wafer shape metrology sub-system 102 may include a Patterned Wafer Geometry (PWG) tool such as the PWG tool produced by KLA INC. The use of interferometry for wafer characterization is generally described in U.S. Pat. No. 6,847,458, filed on Mar. 20, 2003; U.S. Pat. No. 8,949,057, filed on Oct. 27, 2011; and U.S. Pat. No. 9,121,684. filed on Jan. 15, 2013, which are incorporated herein by reference in their entirety.

It is noted that additional or alternative embodiments of the wafer shape metrology sub-system 102 are described in detail in U.S. patent application Ser. No. 17/161,369, filed on Jan. 28, 2021, which is incorporated by reference herein in its entirety.

It is further noted herein that the scope of the present disclosure is not limited to dual interferometer systems of a PWG implementation and may be extended to encompass any wafer shape metrology sub-system or tool known in the art including, but not limited to, single-sided interferometer systems.

In embodiments, as shown in FIG. 1B, the wafer shape metrology sub-system 102 may perform (1) shape measurements on a pre-bonding first wafer; (2) shape measurements on a pre-bonding second wafer; and (3) shape measurements on the post-bonding pair of wafers. It is noted that measurements on the pre-bonded first and second wafers may be used to predict shape of the post-bonded pair of wafers based on mismatch of the shapes of the first and second wafers and the effect of the bonder and bonding process on the post-bonded pair.

In embodiments, the wafer shape metrology sub-system 102 may perform a first shape measurement on a first wafer 110 and then transmit the shape measurement data to the controller 104 via data signal 103$a$. The wafer shape metrology sub-system 102 may perform a second shape measurement on a second wafer 110 and then transmit the shape measurement data to the controller 104 via data signal 103$b$. Then, the first wafer 110 and the second wafer 110 may undergo a bonding process via a bonding tool 112 to form a post-bonding wafer pair 110. The wafer shape metrology sub-system 102 may perform a third shape measurement on the post-bonding wafer pair 110 and then transmit the shape measurement data to the controller 104 via data signal 103$c$.

In embodiments, bonding tool 112 may include one or more adjustors 114, where the one or more adjustors 114 correspond to one or more actuators on the bonding tool 112. For example, the bonding tool 112 may include three adjustors 114a, 114b, and 114c, each of which corresponds to a single actuator. In embodiments, adjustors 114 may be automatically modified, manually modified, and the like. In embodiments, one or more actuators may be controlled heaters for adjusting the temperature of one of the wafers relative to the other one during the bonding process. For example, one wafer will experience a larger thermal expansion relative to the other, generating a distortion pattern. Similarly, a controlled, bow-like deformation of one of the chucks will result in a distortion pattern. The resulting distortion patterns can be modeled using a standard model that describes the vector map using a linear function of wafer coordinates. For another example, the distortion pattern is generated when the bonding process is initiated by pushing the wafers in contact through a pin. The resulting distortion pattern is a distortion pattern that depends on the gap between the wafers, the pressure applied to the pin and distance at which the wafer is held. In this case new modeling patterns need to be applied to generate adjustments.

In embodiments, the controller 104 may generate a bonder control model of overlay distortion patterns. For example, the controller 104 may determine a set of overlay distortion patterns from the wafer shape metrology subsystem and extract the differences in overlay distortion patterns which correlate to adjustments made with the actuators. The differences in overlay distortion patterns which correlate to adjustments made with the actuators (i.e., signatures) may be analyzed to produce a set of orthogonal wafer signatures which may map indirectly or directly to adjustors 114 on the bonding tool 112.

In embodiments, the set of orthogonal wafer signatures may be generated using one or more algorithms. In additional embodiments, the set of orthogonal wafer signatures may map to one or more adjustors 114 on a bonding tool 112. For example, the adjustor induced changes may be analyzed using principal component analysis (PCA) in order to generate an orthogonal set of wafer signatures, wherein the output of PCA is a new set of distortion signatures. The set of distortion signatures may capture the observed variabilities and represent a set of orthogonal signatures, where the signatures represent bonding tool adjustments. In further embodiments, the bonding tool adjustments may map to virtual actuators. An additional step may be required to convert the virtual actuator adjustments to actual actuator adjustments.

The following example is to demonstrate the use of one or more algorithms to generate a set of orthogonal wafer signatures. For example, a multitude of wafer bonding experiments is run with each run representing a specific setting of the bonder actuators. The resulting distortion patterns are measured using wafer shape measurements on the pre as well as the post bonding wafers. The resulting distortion signatures are collected as individual observations and analyzed using a principal component analysis (PCA). The output of PCA is a new set of optimum distortion signatures. In this example, Optimum refers to the fact that distortion signatures capture the observed variabilities and at the same time represent a set of orthogonal signatures. These signatures represent combinations of bonder actuators. In embodiments, bonder actuators may be "virtual actuators"— meaning they no longer represent the adjustment of a single actuator; rather they represent a coordinated adjustment of two or more bonder actuators. Thus an additional step is required to convert the virtual actuator settings to actual actuator adjustments.

Advantages of the present disclosure include the production of a set of orthogonal wafer signatures which may map indirectly or directly to adjustors 114 on the bonding tool 112. An orthogonal set of wafer signatures will produce a unique set of bonder tool adjustments. This proves advantageous with advanced process control, where the results generated from multiple sequential lots are being averaged to predict new adjustments.

In embodiments, the controller 104 may provide one or more control signals 113 to one or more adjustors 114 on one or more bonding tools 112. For example, the controller 104 may generate one or more feedforward and/or feedback control signals corresponding to one or more adjustors 114. In embodiments, the controller 104 may apply a generated bonder control model to a measured distortion pattern and extract the type and magnitude of the overlay distortion signatures between a first wafer and a second wafer of a bonded wafer pair. The controller 104 may then determine a set of bonding tool adjustments based on the type of signatures determined and their magnitude. For example, the controller 104 may determine a new set of actuator conditions based on the type of signatures determined and their magnitude. These settings may either be directly transferred to the bonder (for the rework case) or to an APC system where the corrections are stored and potentially combined with other results to determine the actuator settings for the next lot. The controller may also determine whether the set of proposed bonder tool adjustments are within an acceptable overlay distortion tolerance limit. The controller 104 may provide one or more feedback adjustments to the bonding tool 112 to adjust one or more adjustors 114 when the overlay distortion signatures determined from applying the bonder control model to the set of proposed bonder tool adjustments are not within an acceptable overlay distortion tolerance limit. In additional embodiments, the controller 104 may then determine a new set of actuator conditions based on the type of signatures determined and their magnitude. These settings may either be directly transferred to the bonder or to an APC system where the corrections are stored and potentially combined with other results to determine the actuator settings for future wafer bonding.

The one or more processors 106 of controller 104 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 106 may include any device configured to execute algorithms and/or instructions (e.g., program instructions stored in memory). In one embodiment, the one or more processors 106 may be embodied as a desktop computer, mainframe computer system, workstation, image computer, parallel processor, networked computer, or any other computer system configured to execute a program configured to operate or operate in conjunction with the metrology system 100, as described throughout the present disclosure. Moreover, different subsystems of the system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 104 may include one or more controllers housed in a common housing or within multiple housings. In this way, any controller or combination of controllers may be separately packaged as a module suitable for integration into metrology system 100. Further, the controller 104 may analyze data received from the wafer shape metrology sub-system 102 and feed the data to additional components within the metrology system 100 or external to the metrology system 100.

The memory medium 108 may include any storage medium known in the art suitable for storing program instructions executable by the associated one or more processors 106. For example, the memory medium 108 may include a non-transitory memory medium. By way of another example, the memory medium 108 may include, but is not limited to, a read-only memory (ROM), a random-access memory (RAM), a magnetic or optical memory device (e.g., disk), a magnetic tape, a solid-state drive and the like. It is further noted that memory medium 108 may be housed in a common controller housing with the one or more processors 106. In one embodiment, the memory medium 108 may be located remotely with respect to the physical location of the one or more processors 106 and controller 104. For instance, the one or more processors 106 of controller 104 may access a remote memory (e.g., server), accessible through a network (e.g., internet, intranet and the like).

It is noted herein that the one or more components of the disclosed system 100 may be communicatively coupled to the various other components of the system in any manner known in the art. For example, the wafer shape metrology sub-system 102, controller 104, the bonding tool 112, and a user interface may be communicatively coupled to each other and other components via a wireline (e.g., copper wire, fiber optic cable, and the like) or wireless connection (e.g., RF coupling, IR coupling, data network communication (e.g., WiFi, WiMax, 3G, 4G, 4G LTE, 5G, Bluetooth, and the like)).

FIG. 2 illustrates a flowchart of a method 200 of generating a bonder control model, in accordance with one or more embodiments of the present disclosure. It is noted herein that the steps of method 200 may be implemented all or in part by system 100. It is further recognized, however, that the method 200 is not limited to the system 100 in that additional or alternative system-level embodiments may carry out all or part of the steps of method 200.

In a step 202, a set of wafer pairs with different settings of the bonding actuators are bonded in order to generate a set of overlay distortion patterns. In embodiments, one or more adjustors 114 on a bonding tool 112 may be adjusted with regard to a control set of adjustors 114 and a first wafer 110 and a second wafer 110 bonded into a wafer pair 110.

In a step 204, the overlay distortion patterns are measured using the wafer shape metrology sub-system. In embodiments, as illustrated in FIG. 1B, the wafer shape metrology sub-system 102 may be used to measure a first wafer 110a, a second wafer 110b, and a bonded wafer pair 110a and 110b. For example, the wafer shape metrology sub-system 102 may measure the bonded wafer pair 110a, 110b and then provide one or more measurements to controller 104.

In a step 206, the adjustor induced changes are extracted as the difference in overlay distortion patterns. In embodiments, the overlay distortion patterns may be relative to a known set of actuator settings. In embodiments, the adjustor induced changes may be compared to a set of control adjustor positions in order to extract the difference in overlay distortion patterns. For example, as illustrated in FIG. 1A, the difference between a first overlay distortion pattern created by adjustor 114a in a first position and a second overlay distortion pattern created by adjustor 114a in a second position may be extracted.

In a step 208, a set of orthogonal wafer signatures is generated by analyzing the adjustor induced changes. In embodiments, the set of orthogonal wafer signatures may be generated using various algorithms. In additional embodiments, the set of orthogonal wafer signatures may map to one or more adjustors 114 on a bonding tool 112. For example, the adjustor induced changes may be analyzed using PCA in order to generate an orthogonal set of wafer signatures that represent the achievable control modes and map to one or more adjustors 114 on a bonding tool 112. The use of PCA may be beneficial in that the resulting wafer signatures are orthogonal by construction. With the use of PCA, no further algorithms are necessary in order establish orthogonality. In additional embodiments, non-orthogonal signatures may be prioritized during the optimization process such that a unique set of controls can be generated.

FIG. 3 illustrates a flowchart of a method 300 for utilizing a bonder control model to report feedback to a bonding tool, in accordance with one or more embodiments of the present disclosure. It is noted herein that the steps of method 300 may be implemented all or in part by system 100. It is further recognized, however, that the method 300 is not limited to the system 100 in that additional or alternative system-level embodiments may carry out all or part of the steps of method 300.

In a step 302, a set of proposed bonder tool adjustments is received by the controller. For example, the controller 104 may receive a set of proposed bonder tool adjustments from one or more bonding tools 112, where the bonder tool adjustments correspond to one or more adjustors 114 on the one or more bonding tools 112.

In a step 304, a bonder control model is applied to the set measured wafer distortions to determine a set of overlay distortion signatures between a first wafer and a second wafer of a bonded wafer pair. For example, the controller 104 may apply a bonder control model to a set of measured wafer distortions received from one or more bonding tools 112 to determine a set of overlay distortion signatures between a first wafer and a second wafer of a bonded wafer pair.

For example, the controller 104 may collect and store the pre-bonding shape measurements and then combine it with the shape measurements of the post bonding measurement to obtain the overlay distortion induced by one or more bonding tools 112. The controller will subsequently use stored distortion signatures and attempt to minimize the measured distortion signature by modeling the type and magnitude of the distortion signatures to minimize the predicted signature that can be achieved.

In a step 306, it is determined whether the set of overlay distortion signatures associated with the proposed bonder tool adjustments are outside tolerance limits. For example, the controller 104 may determine whether the set of overlay distortion signatures associated with the proposed bonder tool adjustments are outside an acceptable tolerance by referencing acceptable tolerance data stored in memory 108.

In a step 308, a feedback adjustment is provided to the bonder tool to adjust one or more actuators of the bonder tool. For example, the controller 104 may send a feedback adjustment to bonding tool 112 that corresponds with one or more adjustors 114. In another example, the corrections may be sent to an advanced process control system, wherein the control system may generate bonder tool adjustments.

One skilled in the art will recognize that the herein described components, operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system comprising:
a wafer shape metrology sub-system configured to perform one or more shape measurements on a pair of pre-bonding wafers and a corresponding post-bonding pair of wafers; and
a controller communicatively coupled to the wafer shape metrology sub-system, the controller including one or more processors configured to execute a set of program instructions stored in a memory, the set of program instructions configured to cause the one or more processors to:
generate a bonder control model, wherein generate the bonder control model includes generate a set of stored orthogonal wafer signatures based on actuator-induced changes;
receive a set of measured bonding distortions;
apply the bonder control model to the measured bonding distortions;
determine whether a set of predicted overlay distortion signatures associated with the set of measured bonding distortions are outside tolerance limits; and
provide one or more feedback adjustments to the bonder tool to adjust one or more bonder tool adjustors when the set of predicted overlay distortion signatures are outside tolerance limits.

2. The system of claim 1, wherein the generating the bonder control model comprises:
bonding wafer pairs with different settings of the one or more adjustors of the bonder tool to generate a set of overlay distortion patterns;
measuring at least some of the overlay distortion patterns of the set of overlay distortion patterns using the wafer shape metrology sub-system;
extracting actuator-induced changes as the difference in the overlay distortion patterns relative to a set of control adjustor positions; and
generating the set of stored orthogonal wafer signatures based on the actuator-induced changes.

3. The system of claim 1, wherein the providing one or more feedback adjustments when the set of predicted overlay distortion signatures are outside tolerance limits comprises:
providing the one or more feedback adjustments to the one or more bonder tool adjustors to minimize a predicted overlay distortion signature.

4. The system of claim 3, wherein the one or more bonder tool adjustors is communicatively coupled to one or more actuators on the bonder tool.

5. The system of claim 1, wherein the wafer shape metrology sub-system comprises a first interferometer sub-system and a second interferometer sub-system.

6. A system comprising:
a controller communicatively coupled to a wafer shape metrology sub-system, the controller including one or more processors configured to execute a set of program instructions stored in a memory, the set of program instructions configured to cause the one or more processors to:
generate a bonder control model, wherein generate the bonder control model includes generate a set of stored orthogonal wafer signatures based on actuator-induced changes;
receive a set of measured bonding distortions;
apply the bonder control model to the measured bonding distortions;
determine whether a set of predicted overlay distortion signatures associated with the set of measured bonding distortions are outside tolerance limits; and
provide one or more feedback adjustments to the bonder tool to adjust one or more bonder tool adjustors when the set of predicted overlay distortion signatures are outside tolerance limits.

7. The system of claim 6, wherein the generating the bonder control model comprises:
bonding wafer pairs with different settings of the one or more adjustors of the bonder tool to generate a set of overlay distortion patterns;
measuring at least some of the overlay distortion patterns of the set of overlay distortion patterns using the wafer shape metrology sub-system;
extracting actuator-induced changes as the difference in the overlay distortion patterns relative to a set of control adjustor positions; and
generating the set of stored orthogonal wafer signatures based on the actuator-induced changes.

8. The system of claim 6, wherein the providing one or more feedback adjustments when the set of predicted overlay distortion signatures are outside tolerance limits comprises:
providing the one or more feedback adjustments to the one or more bonder tool adjustors to minimize a predicted overlay distortion signature.

9. The system of claim 6, wherein the one or more bonder tool adjustors is communicatively coupled to one or more actuators on the bonder tool.

10. The system of claim 6, wherein the wafer shape metrology sub-system comprises a first interferometer sub-system and a second interferometer sub-system.

11. A method comprising:
generating a bonder control model, wherein generate the bonder control model includes generate a set of stored orthogonal wafer signatures based on actuator-induced changes;

receiving a set of measured bonding distortions;

applying the bonder control model to the measured bonding distortions;

determining whether a set of predicted overlay distortion signatures associated with the set of measured bonding distortions are outside tolerance limits; and providing one or more feedback adjustments to the bonder tool to adjust one or more bonder tool adjustors when the set of predicted overlay distortion signatures are outside tolerance limits.

12. The method of claim 11, wherein the generating the bonder control model comprises:

bonding wafer pairs with different settings of the one or more adjustors of the bonder tool to generate a set of overlay distortion patterns;

measuring at least some of the overlay distortion patterns of the set of overlay distortion patterns using the wafer shape metrology sub-system;

extracting actuator-induced changes as the difference in the overlay distortion patterns relative to a set of control adjustor positions; and generating the set of stored orthogonal wafer signatures based on the actuator-induced changes.

13. The method of claim 11, further comprising:

generating an adjustor control group via bonding wafer pairs with known adjustor settings.

14. The method of claim 11, wherein the generating a set of orthogonal wafer signatures is achieved through principal component analysis.

15. The method of claim 11, wherein the orthogonal wafer signatures are mapped to one or more bonder tool adjustors.

16. The method of claim 11, wherein the one or more bonder tool adjustors are controlled manually.

17. The method of claim 11, wherein the one or more bonder tool adjustors are controlled via a computer system.

18. The method of claim of 11, wherein the extracting actuator-induced changes as the difference in the overlay distortion patterns relative to a set of control adjustor positions comprises:

comparing the actuator induced changes to the adjustor control group.

* * * * *